(12) United States Patent
Lin

(10) Patent No.: US 8,390,264 B2
(45) Date of Patent: Mar. 5, 2013

(54) DIFFERENTIAL REFERENCE VOLTAGE GENERATOR

(75) Inventor: Wen-Sheng Lin, Sinshih Township, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 480 days.

(21) Appl. No.: 12/729,416

(22) Filed: Mar. 23, 2010

(65) Prior Publication Data
US 2011/0234198 A1    Sep. 29, 2011

(51) Int. Cl.
G05F 3/08    (2006.01)
(52) U.S. Cl. .................................... 323/314; 323/281
(58) Field of Classification Search .......... 323/313–314, 323/273–281, 293, 297
See application file for complete search history.

(56) References Cited

U.S. PATENT DOCUMENTS

| | | | |
|---|---|---|---|
| 6,509,858 B2 * | 1/2003 | Karanicolas | 341/155 |
| 6,600,439 B1 * | 7/2003 | Pahr | 341/158 |
| 6,873,143 B2 * | 3/2005 | Moon et al. | 323/312 |
| 6,888,340 B1 * | 5/2005 | Chen | 323/316 |
| 7,224,209 B2 * | 5/2007 | Hsu | 327/538 |

* cited by examiner

*Primary Examiner* — Harry Behm
(74) *Attorney, Agent, or Firm* — McClure, Qualey & Rodack, LLP

(57) ABSTRACT

A differential reference voltage generator generates a first differential reference voltage and a second differential reference voltage. The differential reference voltage generator includes a first operational amplifier, a first transistor, a first resistor, and a second resistor. The first operational amplifier has a negative terminal adapted to receive a reference voltage. The first transistor has a source receiving a power supply voltage and has a gate electrically connected to an output terminal of the first operational amplifier. The first resistor has a first terminal electrically connected to a drain of the first transistor, and has a second terminal electrically connected to a positive terminal of the first operation amplifier. The second resistor has a first terminal electrically connected to the second terminal of the first resistor, and a second terminal electrically connect to a current mirror.

4 Claims, 1 Drawing Sheet

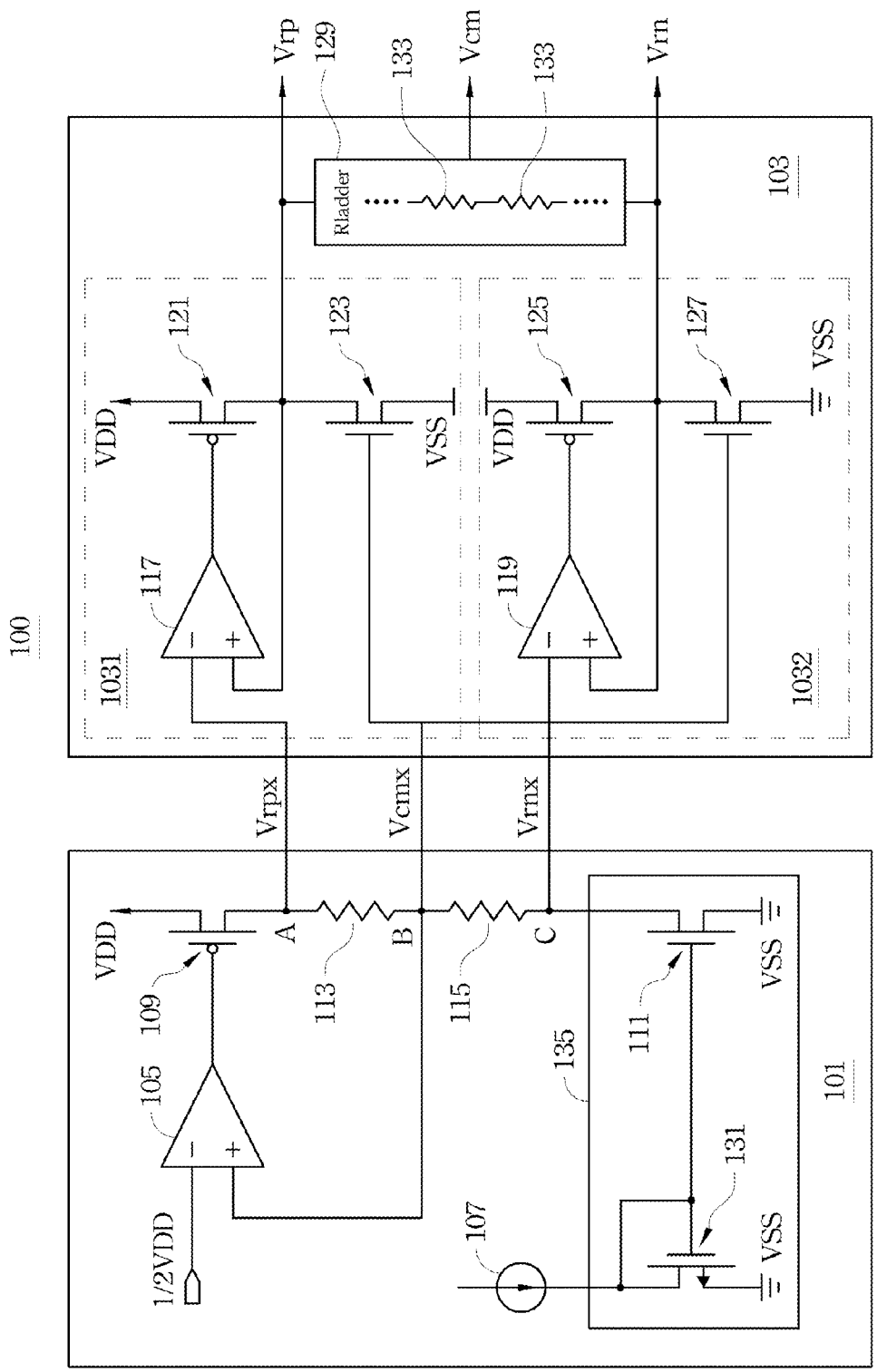

DIFFERENTIAL REFERENCE VOLTAGE GENERATOR

BACKGROUND

1. Field of Invention

The present invention relates to a differential reference voltage generator. More particularly, the present invention relates to a differential reference voltage generator applied to an analog to digital converter.

2. Description of Related Art

In general, a pipelined analog-to-digital converter (ADC) is a multi-step quantizer, in which a plurality of ADCs are cascade-coupled with one another, and in which each of the ADCs has the same or similar configurations with one another. A conventional pipelined ADC includes a plurality of stages, and each of the stages includes a sample-and-hold (S/H) circuit, a digital-to-analog converter (DAC), and a residue amplifier; furthermore, a reference voltage driver is employed in the conventional pipelined ADC for providing the differential reference voltages to those circuits.

The stability of the differential reference voltage directly affects the performance of the pipelined ADC, therefore, a precise differential reference voltage is required for driving capacitors in each of the pipelined ADC stages, so that the pipelined ADC can operate precisely. However, the differential reference voltages vary as the power supply voltage changes due to the progress of the manufacture process, which might cause the pipelined ADC operates abnormally.

Hence, there is a need for a new differential reference voltage generator which can produce stable differential reference voltage and can make the pipelined ADC operate normally.

SUMMARY

According to one embodiment of the present invention, a differential reference voltage generator which generates a first differential reference voltage and a second differential reference voltage includes a first operational amplifier, a first transistor, a first resistor, and a second resistor. The first operational amplifier has a negative terminal adapted to receive a reference voltage. The first transistor has a source receiving a power supply voltage and has a gate electrically connected to an output terminal of the first operational amplifier. The first resistor has a first terminal electrically connected to a drain of the first transistor for outputting the first differential reference voltage, and has a second terminal electrically connected to a positive terminal of the first operation amplifier. The second resistor has a first terminal electrically connected to the second terminal of the first resistor, and has a second terminal electrically connect to a current mirror for outputting the second differential reference voltage.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

FIG. 1 shows the circuit diagram of the differential reference voltage generator according to one embodiment of the present invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIG. 1 shows the circuit diagram of the differential reference voltage generator according to one embodiment of the present invention. The differential reference voltage generator 100 generates a first differential reference voltage and a second differential reference voltage required by an analog to digital converter, such as a pipelined analog to digital converter. The differential reference voltage generator 100 includes the voltage generating circuit 101 to generate the differential reference voltages and the buffer unit 103 to enhance the driving ability of the differential reference voltages.

The voltage generating circuit 101 includes a first operational amplifier 105, a first transistor 109, a first resistor 113, a second resistor 115 and a current mirror 135. The first operational amplifier 105 has a negative terminal (−) receiving a reference voltage such as a half power supply voltage ½ VDD, in which the half power supply voltage ½ VDD is used as the common voltage inputted to the digital to analog converter. The first transistor 109, such as a PMOS transistor, has a source receiving the power supply voltage VDD and also has a gate electrically connected to the output terminal of the first operational amplifier 105.

The first resistor 113 has a first terminal A and a second terminal B. The first terminal A, electrically connected to a drain of the first transistor 109, outputs the first differential reference voltage Vrpx. The second terminal B of the first resistor 113 is electrically connected to a positive terminal (+) of the first operation amplifier 105 and the first terminal of the second resistor 115. The second resistor 115 also has a second terminal C electrically connect to a current mirror 135 for outputting and providing the second differential reference voltage Vrnx, in which the second terminal C is flowed through by the constant current provide by the current mirror 135.

The total voltage drop across the first resistor 113 as well as the second resistor 115 remains a constant, while the resistances and the voltage drops of the individual first resistor 113 and the individual second resistor 115 might be the same or different. In the case providing symmetrical differential reference voltages, the first resistor 113 and the second resistor 115 have the same resistances, such that voltage drop across the first resistor 113 is equal to the voltage drop across the second resistor 115, and the average value of the first differential reference voltage in view of the second differential reference voltage is equal to the half power supply voltage or ½ VDD. In other cases, the first resistor 113 could have a resistance different from that of the second resistor 115.

In the voltage generating circuit 101 of this embodiment, the voltage levels on the positive terminal (+) and the negative terminal (−) of the first operating amplifier 105 are the same due to the intrinsic virtual short characteristic of the operation amplifier 105, such that the voltage on the second terminal B, the common voltage, is substantially equal to the half power supply voltage ½ VDD. With such configuration, the voltage on the second terminal B is usually kept as the half of the power supply voltage VDD, while the voltage value of the power supply voltage VDD might change from time to time.

The current mirror 135 supplies a constant current for the second resister 115 by reproducing the constant current source 107. If the resistances of the first resistor 113 and the second resistor 115 are kept the same, the total voltage drop across the first resistor 113 as well as the second resistor 115 will consequently be a constant value.

The current mirror 101 includes a first mirror transistor 131 and a second mirror transistor 111. In more detail, the first mirror transistor 131 has a source connected to a ground terminal VSS and has a drain and a gate electrically connected together, in which the drain of the first mirror transistor receives the current provided by the constant current source 107. The second mirror transistor 111 has a source connected to the ground terminal VSS and has a gate connected to the gate of the first mirror transistor 131. In addition, the second mirror transistor 111 has a drain connected to the second terminal C of the second resistor 115.

The buffer unit 103 which enhances the driving ability of the first differential reference voltage Vrpx and the second differential reference voltage Vrnx includes a first buffer circuit 1031 and a second buffer circuit 1032. In this embodiment, the first buffer circuit 1031 and the second buffer 1032 have the same architecture and respectively receives the first differential reference voltage Vrpx and the second differential reference voltage Vrnx to output the enhanced first differential reference voltage Vrp and the enhanced second differential reference voltage Vrn. The first/second buffer circuit 1031/1032 includes a second operational amplifier 117/119, a second transistor 121/125 and a third transistor 123/127. The second operational amplifier 117/119 has a negative terminal for receiving the first/second differential reference voltage Vrpx/Vrnx. The second transistor 121/125 has a source receiving the power supply voltage VDD, a gate electrically connected to an output terminal of the second operational amplifier 117/119, and a drain electrically connected to a positive terminal of the second operational amplifier 117/119 for outputting the enhanced first/second differential reference voltage Vrp/Vrn. The third transistor 123/127 has a gate electrically connected to the second terminal of the first resistor 113, a drain electrically connected to the drain of the second transistor 121/125, and a source electrically connected to a ground terminal VSS. In additional, the resistor string 129 is connected between the enhanced first and second differential reference voltage Vrp, Vrn to provide several different level voltages which include a common voltage Vcm. The resistor string 129, electrically connected to the positive terminals of the second operational amplifier 117 and the third operational amplifier 119, has many string resistors 133 which provide terminal voltages on their terminals as shown in FIG. 1.

In the buffer unit 103 of this embodiment, the first transistor 109 and the second transistors 121,125 are the P channel transistors, while the third transistors 123, 127 are the N channel transistors.

According to the above embodiment, the common voltage provided by the differential reference voltage generator can vary along with the variation of the power supply, which prevents the common voltage and the differential reference voltage from being affected by the manufacturing process. In addition, the driving ability of the differential reference voltages are enhanced, and the analog to digital converter can be effectively driven.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A differential reference voltage generator for generating a first differential reference voltage and a second differential reference voltage, comprising:
    a first operational amplifier having a negative terminal adapted to receive a reference voltage;
    a first transistor having a source receiving a power supply voltage and having a gate electrically connected to an output terminal of the first operational amplifier;
    a first resistor having:
    a first terminal electrically connected to a drain of the first transistor, for outputting the first differential reference voltage; and
    a second terminal electrically connected to a positive terminal of the first operational amplifier; and
    a second resistor having:
    a first terminal electrically connected to the second terminal of the first resistor; and
    a second terminal, electrically connected to a current mirror, for outputting the second differential reference voltage; and
    a plurality of buffer circuits for, respectively, enhancing driving ability of the first differential reference voltage and the second differential reference voltage, wherein each of the buffer circuit comprises:
    a second operational amplifier having a negative terminal for receiving the first/second differential reference voltage;
    a second transistor having a source receiving the power supply voltage having a gate electrically connected to an output terminal of the second operational amplifier and having a drain electrically connected to a positive terminal of the second operational amplifier for outputting an enhanced first/second differential reference voltage; and
    a third transistor having a gate electrically connected to the second terminal of the first resistor, a drain electrically connected to a drain of the second transistor and a source electrically connected to a ground terminal.

2. The differential reference voltage generator as claimed in claim 1, wherein the current mirror supplies a constant current for the second resistor by reproducing a constant current source.

3. The differential reference voltage generator as claimed in claim 2, wherein the current mirror comprises:
    a first mirror transistor having a source connected to a ground terminal and having a drain and a gate electrically connected together, wherein the drain of the first mirror transistor receives the current form the constant current source; and
    a second mirror transistor having a source connected to the ground terminal, having a gate connected to the gate of the first mirror transistor, and having a drain connected to the second terminal of the second resistor.

4. The differential reference voltage generator as claimed in claim 1, wherein the first transistor and the second transistor are P channel transistors, and the third transistor is an N channel transistor.

* * * * *